(12) United States Patent
Huang

(10) Patent No.: US 9,244,489 B2
(45) Date of Patent: Jan. 26, 2016

(54) DISPLAY DEVICE

(71) Applicant: HON HAI PRECISION INDUSTRY CO., LTD., New Taipei (TW)

(72) Inventor: Fu-Kuo Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 51 days.

(21) Appl. No.: 14/074,018

(22) Filed: Nov. 7, 2013

(65) Prior Publication Data

US 2014/0313647 A1 Oct. 23, 2014

(51) Int. Cl.
*H05K 5/02* (2006.01)
*G06F 1/16* (2006.01)
*H05K 5/00* (2006.01)

(52) U.S. Cl.
CPC ............ *G06F 1/1607* (2013.01); *H05K 5/0247* (2013.01); *H05K 5/0017* (2013.01)

(58) Field of Classification Search
CPC ....... G06F 1/1607; G06F 1/1613; G06F 1/16; G06F 19/3406; G06F 1/1626; G06F 1/1632; G06F 1/1637; G06F 1/1656; G06F 1/182; G06F 1/203; G06F 21/60; G06F 3/016; G06F 3/0416; H05K 1/028; H05K 1/111; H05K 1/117; H05K 1/118; H05K 2201/2009; H05K 5/0204; H05K 7/1491; H05K 5/0217; H05K 7/14; H05K 2201/10386; H05K 2201/10446; H05K 2201/10613; H05K 7/1447; H05K 9/007; H05K 9/0079; H05K 5/0247; H05K 5/0017
USPC ............ 361/679.01, 679.02, 679.08, 670.09, 361/679.21, 679.26, 679.27, 679.22, 361/679.28, 679.29; 248/917–924
See application file for complete search history.

(56) References Cited

U.S. PATENT DOCUMENTS

| | | | | |
|---|---|---|---|---|
| 4,864,523 A | * | 9/1989 | Sasaki | 361/679.09 |
| 5,394,297 A | * | 2/1995 | Toedter | 361/679.28 |
| 5,793,606 A | * | 8/1998 | Cubbage et al. | 361/679.29 |

* cited by examiner

*Primary Examiner* — Anthony Haughton
*Assistant Examiner* — Ingrid Wright
(74) *Attorney, Agent, or Firm* — Novak Druce Connolly Bove + Quigg LLP

(57) ABSTRACT

A display device includes a chassis and a cable. The chassis includes two first sidewalls and two second sidewalls. A receiving hole is defined in the chassis and includes two first receiving portions and two second receiving portions. Each first receiving portion is defined in each first sidewall, and each second receiving portion is defined in each second sidewall. The cable is received in the receiving hole.

14 Claims, 3 Drawing Sheets

DISPLAY DEVICE

BACKGROUND

1. Technical Field

The present disclosure relates to electronic devices, and particularly to a display device.

2. Description of Related Art

A display device is connected to another electronic device by a cable. Usually, the cable is separated from display device, and it is inconvenient to transport the display device and the cable together. Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
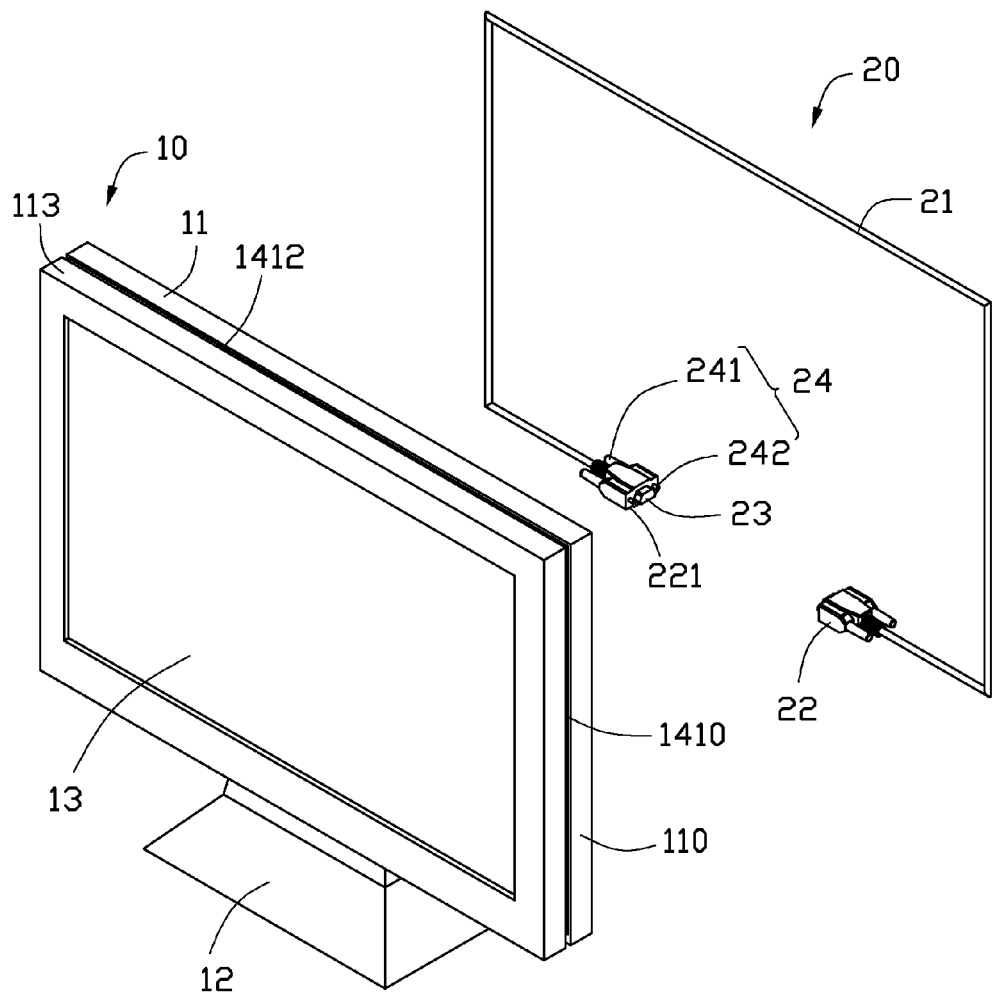
FIG. 1 is an exploded, isometric view of a display device in accordance with an embodiment.
Figure 2:
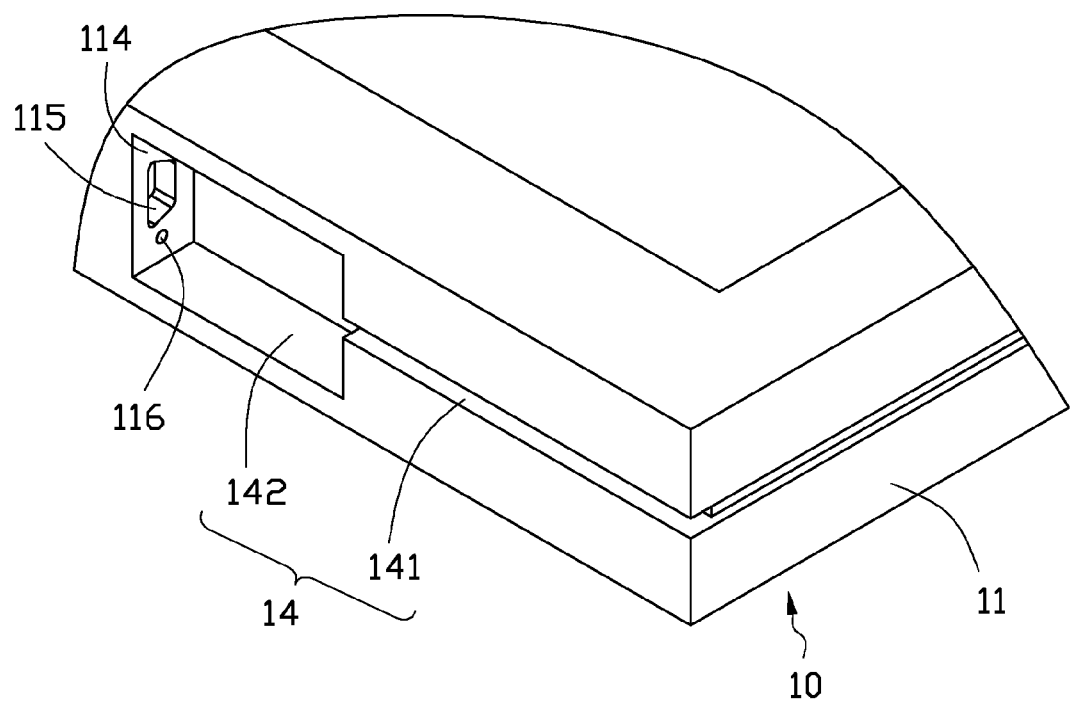
FIG. 2 is a cutaway view of a chassis of the display device of FIG. 1.
Figure 3:
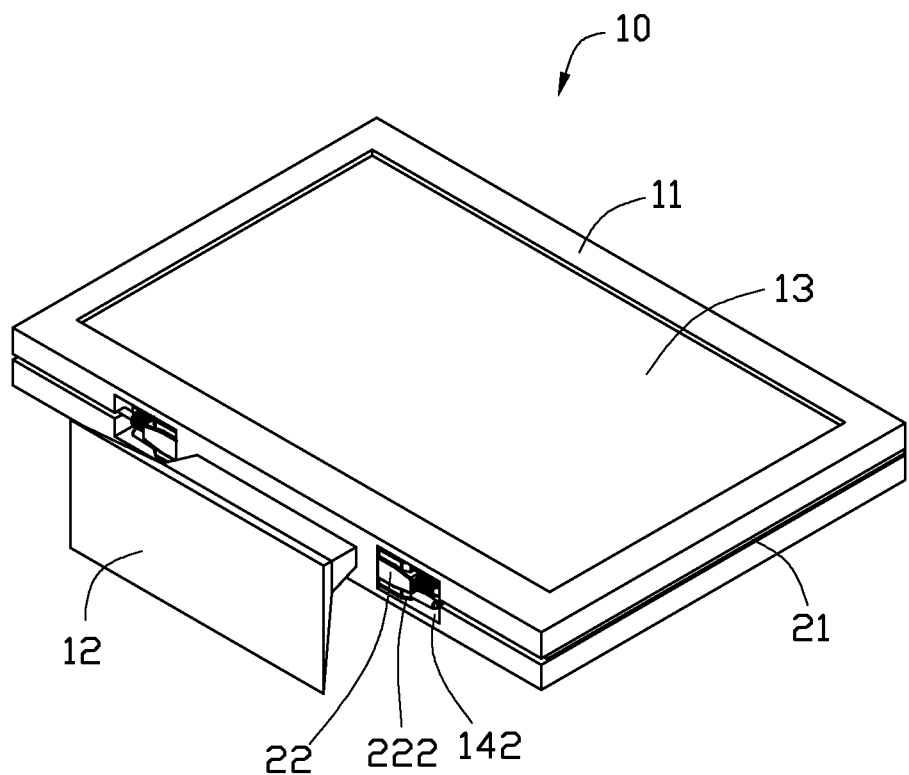
FIG. 3 is an assembled view of the display device of FIG. 1.

FIGS. 1-3 illustrate an embodiment of a display device. The display device comprises a chassis 11, a screen 13 located on a front side of the chassis 11, a supporting base 12 located on a bottom of the chassis 11, and a cable 20. The cable 20 is used to connect the display device to an electronic device (not shown), such as a computer host.

The chassis 11 is substantially a rectangle and comprises two first sidewalls 110 and two second sidewalls 113. The two first side walls 110 are substantially parallel to each other and perpendicular to the two second sidewalls 113. A length of each second sidewall 113 is greater than a length of each first sidewall 110.

A receiving hole 14 is defined in the chassis 11. In one embodiment, the receiving hole 14 comprises a main receiving area 141 and two clipping areas 142 located at opposite ends of the main receiving area 141. The main receiving area 141 comprises two first receiving portions 1410 and two second receiving portions 1412. Each first receiving portion 1410 is defined in each first sidewall 110 and communicates with the two second receiving portions 1412. Each second receiving portion 1412 is defined in each second sidewall 113 and communicates with two first receiving portions 1410. The two clipping areas 142 are located opposite of the base 12, and each clipping area 142 communicates with one of the two second receiving portions 1412. A depth of each clipping area 142 is substantially equal to a depth of the main receiving area 141. Each clipping area 142 comprises a securing wall 114. An engaging hole 115 and two securing holes 116 (only one is shown in FIG. 2) are defined in the securing wall 114. The engaging hole 115 is located between the two securing holes 116. In one embodiment, a cross-section of the engaging hole 115 is a trapezoid. Each securing hole 116 defines an inner screw thread (not shown).

The cable 20 comprises a main body 21 and two connectors 22 connected to opposite ends of the cable 20. Each connector 22 comprises an inserting portion 23 and two mounting members 24 located on opposite sides of the inserting portions 23. In one embodiment, a cross-section of the inserting portion 23 is substantially a trapezoid. Each mounting member 24 comprises a handle 241 and a screw 242 connected to the handle 241. The screw 242 is adjacent to the inserting portion 23, and the screw 242 can be rotated by the handle 241.

In assembly, the main body 21 is received in the main receiving area 141, and each connector 22 is received in the corresponding clipping area 142. The inserting portion 23 of each connector 22 is engaged in the corresponding engaging hole 115. Each screw 242 is aligned with each corresponding securing hole 116. Each handle 241 is rotated, and the screw 242 is engaged with the corresponding securing hole 116. Thus, the cable 20 is secured to the chassis 11.

In disassembly, the screws 242 are detached from the corresponding securing holes 116, the inserting portions 23 are removed from the corresponding engaging hole 115, and the connectors 22 can be disengaged from the clipping area 142. The main body 21 is removed from the main receiving area 141, to disengage the cable 20 from the chassis 11. Thus, the cable 20 can connect the display device to the electronic device.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A display device comprising:
   a chassis comprising two first sidewalls parallel to each other and two second sidewalls parallel to each other, each second sidewall substantially perpendicular to each first sidewall; a receiving hole is defined in the chassis and extending through the two first sidewalls and the two second sidewalls, and the receiving hole comprises two first receiving portions and two second receiving portions; each first receiving portion is defined in each first sidewall, and each second receiving portion is defined in each second sidewall; and
   a cable; the cable is received in the receiving hole and extends through each of the two first sidewalls and each of the two second sidewalls to be engaged in the two first receiving portions and the two second receiving portions.

2. The display device of claim 1, wherein the receiving hole comprises a main receiving area and two clipping areas, the cable comprises a main body and two connectors connected to the main body, the main body is received in the main receiving area, and each connector is received in each clipping area.

3. The display device of claim 2, further comprising a base connected to the chassis, wherein the two clipping areas are located between opposite sides of the base.

4. The display device of claim 2, wherein a depth of each clipping area is substantially equal to a depth of the main receiving area.

5. The display device of claim 2, wherein each clipping area comprises a securing wall, the securing wall defines an engaging hole, and each connector comprises an inserting portion engaged in the engaging hole.

6. The display device of claim 5, wherein the securing wall further defines a securing hole, and each connector further comprises a mounting member engaged in the securing hole.

7. The display device of claim 6, wherein the mounting member comprise a handle and a screw connected to the handle, and the screw is engaged in the securing hole by the handle.

8. A display device comprising:
a chassis comprising two first sidewalls parallel to each other and two second sidewalls parallel to each other, each second sidewall substantially perpendicular to each first sidewall; a receiving hole is defined in the chassis and extending through the two first sidewalls and the two second sidewalls and comprises two first receiving portions and two second receiving portions; each first receiving portion is defined in each first sidewall and communicates with each second receiving portion, and each second receiving portion is defined in each second sidewall and communicates with each first receiving portion;
a screen located on the chassis;
a base connected to the chassis; and
a cable; the cable is received in the receiving hole and extends through each of the two first sidewalls and each of the two second sidewalls to be engaged in the two first receiving portions and the two second receiving portions.

9. The display device of claim 8, wherein the receiving hole comprises a main receiving area and two clipping areas, the cable comprises a main body and two connectors connected to the main body, the main body is received in the main receiving area, and each connector is received in each clipping area.

10. The display device of claim 9, wherein the two clipping areas are located between opposite sides of the base.

11. The display device of claim 9, wherein a depth of each clipping area is substantially equal to a depth of the main receiving area.

12. The display device of claim 9, wherein each clipping area comprises a securing wall, the securing wall defines an engaging hole, and each connector comprises an inserting portion engaged in the engaging hole.

13. The display device of claim 12, wherein the securing wall further defines a securing hole, and each connector further comprises a mounting member engaged in the securing hole.

14. The display device of claim 13, wherein the mounting member comprise a handle and a screw connected to the handle, and the screw is engaged in the securing hole by the handle.

* * * * *